(12) United States Patent
Zeller et al.

(10) Patent No.: US 12,248,048 B1
(45) Date of Patent: Mar. 11, 2025

(54) METHOD FOR MAGNETIC RESONANCE IMAGING, MAGNETIC RESONANCE IMAGING SYSTEM AND COMPUTER PROGRAM PRODUCT

(71) Applicant: Siemens Healthineers AG, Forchheim (DE)

(72) Inventors: Mario Zeller, Erlangen (DE); Nadine Dispenza, Erlangen (DE); Dominik Paul, Bubenreuth (DE); Christian Meixner, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 18/830,752

(22) Filed: Sep. 11, 2024

(30) Foreign Application Priority Data

Sep. 12, 2023 (EP) ..................... 23196927

(51) Int. Cl.
*G01R 33/561* (2006.01)
*G01R 33/56* (2006.01)

(52) U.S. Cl.
CPC ..... *G01R 33/5616* (2013.01); *G01R 33/5608* (2013.01)

(58) Field of Classification Search
CPC .................. G01R 33/5608; G01R 33/5616
See application file for complete search history.

(56) References Cited

U.S. PATENT DOCUMENTS

| 3,824,452 A * | 7/1974 | Freeman ............ G01R 33/4616 324/312 |
| 9,285,445 B2 * | 3/2016 | Wong .................. G01R 33/4836 |
| 11,313,934 B2 * | 4/2022 | Zeller ................ G01R 33/5611 |
| 2023/0309850 A1 | 10/2023 | Zeller et al. |

FOREIGN PATENT DOCUMENTS

CN          100346171 C        10/2007

OTHER PUBLICATIONS

Le Bihan D et al.: "Artifacts and Pitfalls in diffusion MRI"; Journal of Magnetic Resonance Imaging; Bd. 24; Nr. 3; published: Sep. 1, 2006; pp. 478-488; XP007913472; ISSN: 1053-1807; DOI: 10.1002/JMRI.20683.
Reber, Jonas et al.: "Correction of Gradient Induced Clock Phase Modulation for In-Bore Sampling Receivers", Proc. Intl. Soc. Mag. Reson. Med; Honolulu, USA; 2017, 25. Jg., pp. 1056.
Feb. 8, 2024 (EP) Search Report—App. 23196927.0 (w/ English Translation).

* cited by examiner

*Primary Examiner* — Gregory H Curran
(74) *Attorney, Agent, or Firm* — Banner & Witcoff Ltd.

(57) ABSTRACT

In method for MR imaging, an MR signal is acquired for each of a plurality of readout gradient pulses during a respective readout period and an MR image is generated on the basis thereof. A start time of the respective readout period relative to a start time of the respective readout gradient pulse is delayed by a delay duration which is selected randomly or pseudo-randomly from two or more predefined time values, and/or to generate the MR image, the acquired MR signals are processed, wherein the processing includes a frequency conversion based around a center frequency which is randomly or pseudo-randomly selected from two or more predetermined frequency values.

15 Claims, 5 Drawing Sheets

Figure 1:
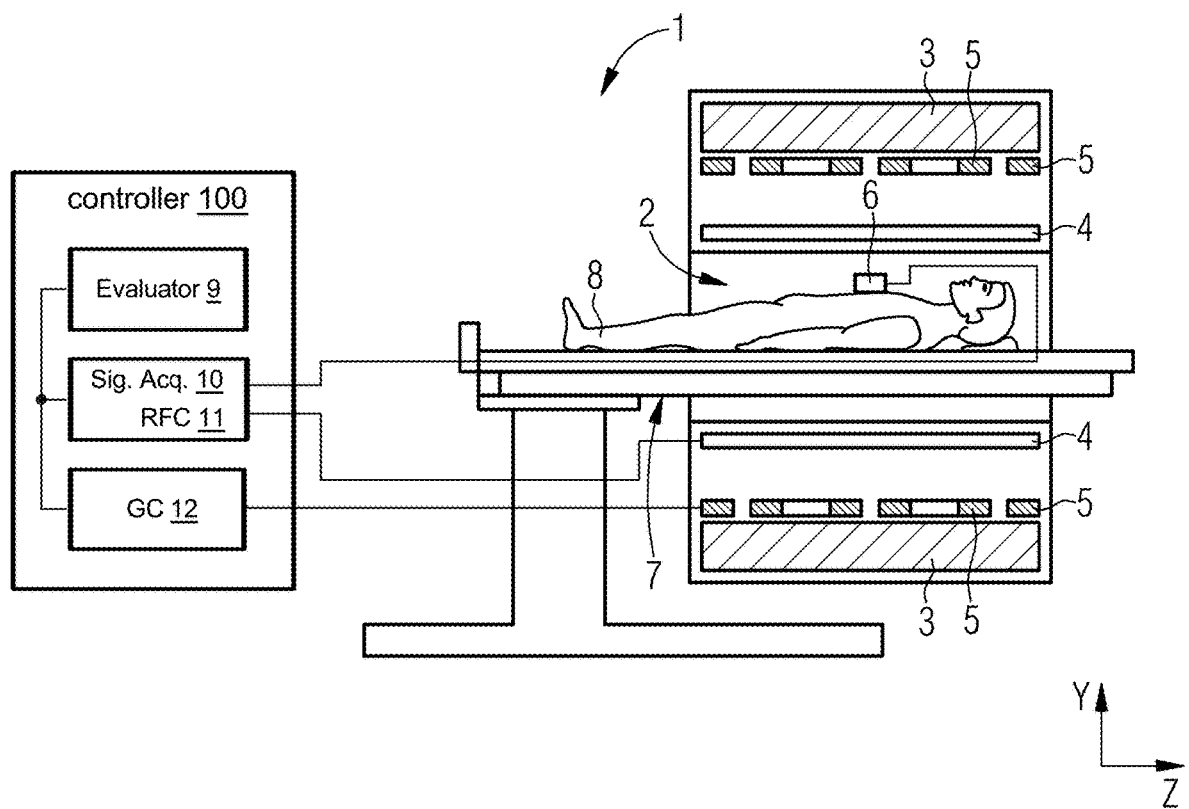

METHOD FOR MAGNETIC RESONANCE IMAGING, MAGNETIC RESONANCE IMAGING SYSTEM AND COMPUTER PROGRAM PRODUCT

CROSS REFERENCE TO RELATED APPLICATIONS

This patent application claims priority to European Patent Application No. 23196927.0, filed Sep. 12, 2023, which is incorporated herein by reference in its entirety.

BACKGROUND

Field

Magnetic resonance imaging (MRI) systems are imaging devices that use a strong external magnetic field to align the nuclear spins of an object to be examined and excite them to precess around the corresponding alignment by applying an RF excitation pulse. The precession or the transition of the spins from this excited state to a lower-energy state generates in response an electromagnetic alternating field that can be acquired as an MR signal via receiving antennas.

Related Art

Magnetic gradient fields, for example as gradient pulses, are used to position-encode the signals, enabling the received MR signal to be assigned to a volume element of the object to be examined. The gradient pulses can be applied in three different spatial directions that are for example perpendicular to one another and are referred to as the X, Y and Z directions. According to a common convention, the Z direction is parallel to the external main magnetic field, so that gradient pulses in the Z direction are used to select a slice to be imaged in the object and are also termed slice selection gradients. In the aforementioned convention, phase encoding takes place as position encoding in the Y direction, and frequency encoding in the X direction.

The received MR signal can then be evaluated to obtain an image display of the object under examination, for example. As the MR signal has a radiofrequency carrier signal whose frequency is at the Larmor frequency of the nuclear spins, but the actually relevant information is in the low-frequency range, the evaluation of the MR signals for image reconstruction usually involves frequency conversion in order to reduce the frequency, for example by downmixing the MR signals with the Larmor frequency as the center frequency.

To receive the MR signals, for example, readout gradient pulses are switched, the latter being in particular gradient pulses in the frequency encoding direction, i.e. in the X direction. During the readout gradient pulses, the electronics for reading out the MR signal, which in particular include an analog-to-digital converter (ADC), are activated in corresponding readout periods. For example, the ADC is described as being switched.

The readout gradient pulses are for example approximately rectangular pulses. In reality, however, the edges of a readout gradient pulse usually extend over a very short time period. A typical shape of a readout gradient pulse is therefore an approximately linearly rising edge, also known as a gradient ramp or ramp phase, followed by a region of approximately constant amplitude, also known as a gradient flat top or plateau phase, followed in turn by an approximately linearly falling edge.

So-called glitches are disturbances at the edge of k-space that can result from the simultaneous switching of the ADC and numerically controlled oscillators (NCO). These disturbances are temporally linked to the start of the respective readout period. Other disturbances may also be temporally linked to the start of the respective readout period.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 schematically illustrates a MR imaging system according to one or more exemplary embodiments of the disclosure.

Figure 2:
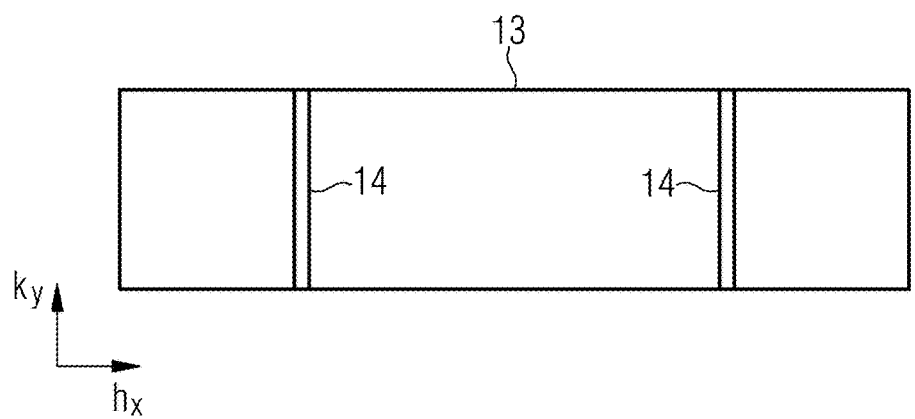

FIG. 2 schematically illustrates an MR recording in k-space according to one or more exemplary embodiments of the disclosure.

Figure 3:
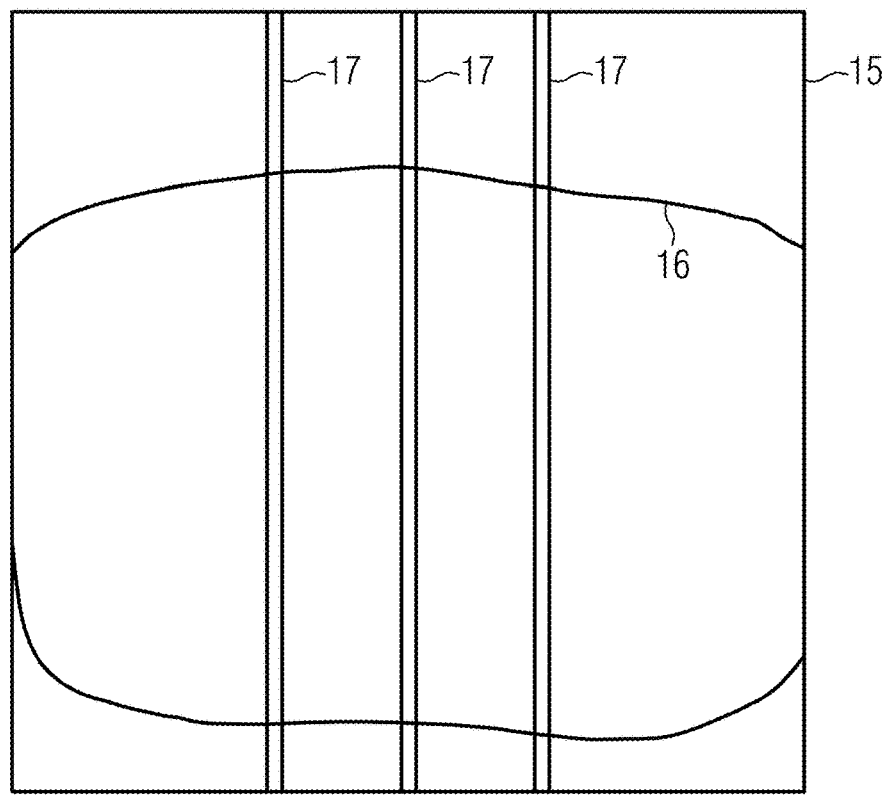

FIG. 3 schematically illustrates an MR image in real space according to one or more exemplary embodiments of the disclosure.

Figure 4:
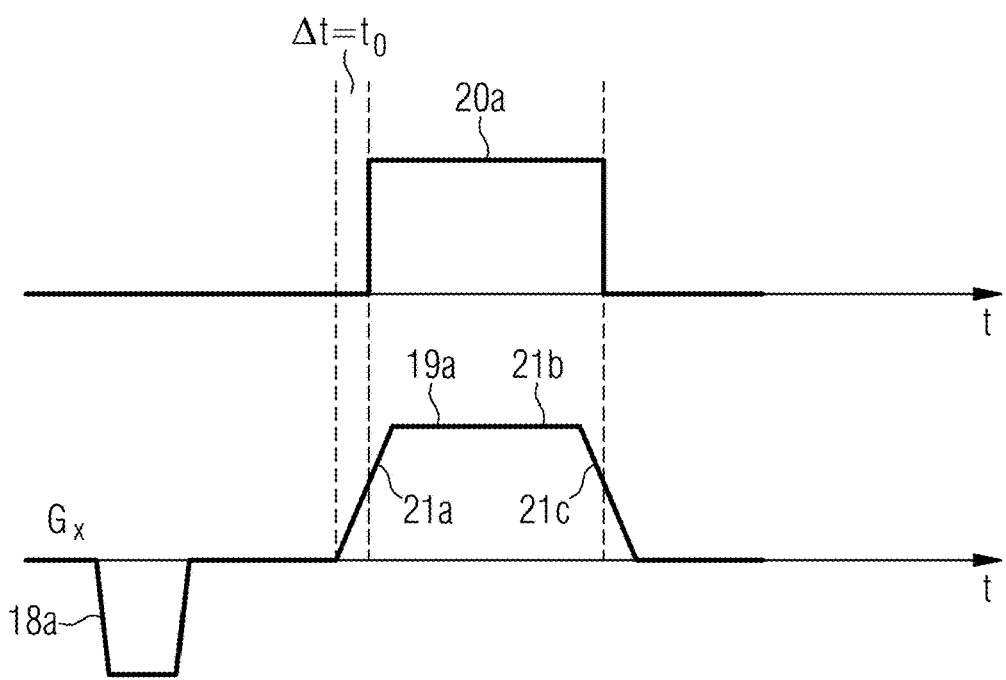

FIG. 4 schematically illustrates a measurement sequence of a method for MR imaging according to one or more exemplary embodiments of the disclosure.

Figure 5:
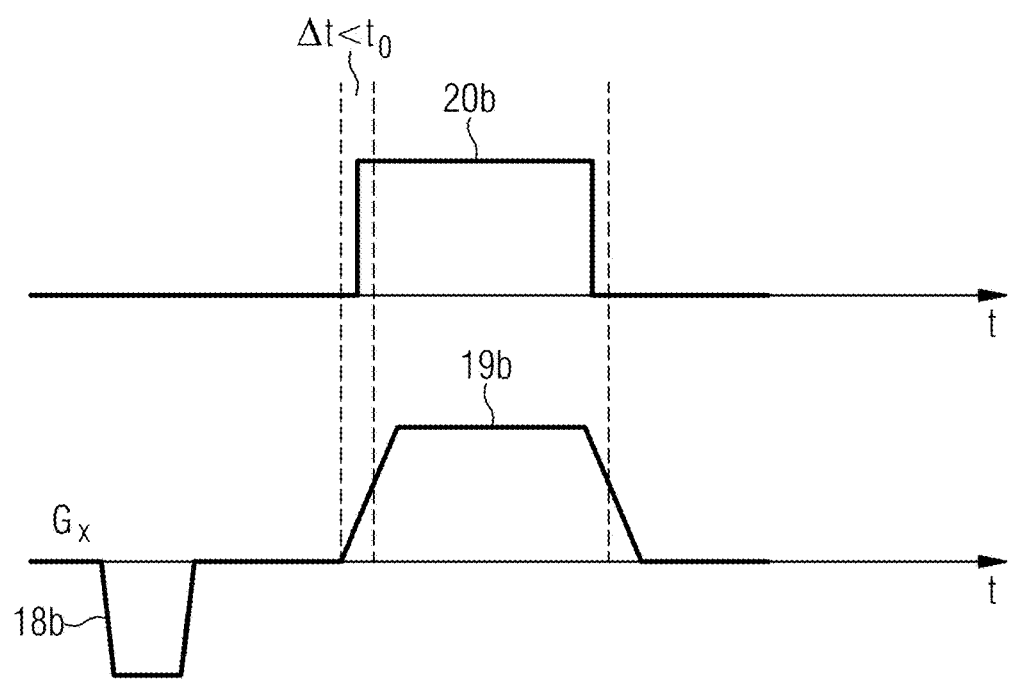

FIG. 5 schematically illustrates a measurement sequence of a method for MR imaging according to one or more exemplary embodiments of the disclosure.

Figure 6:
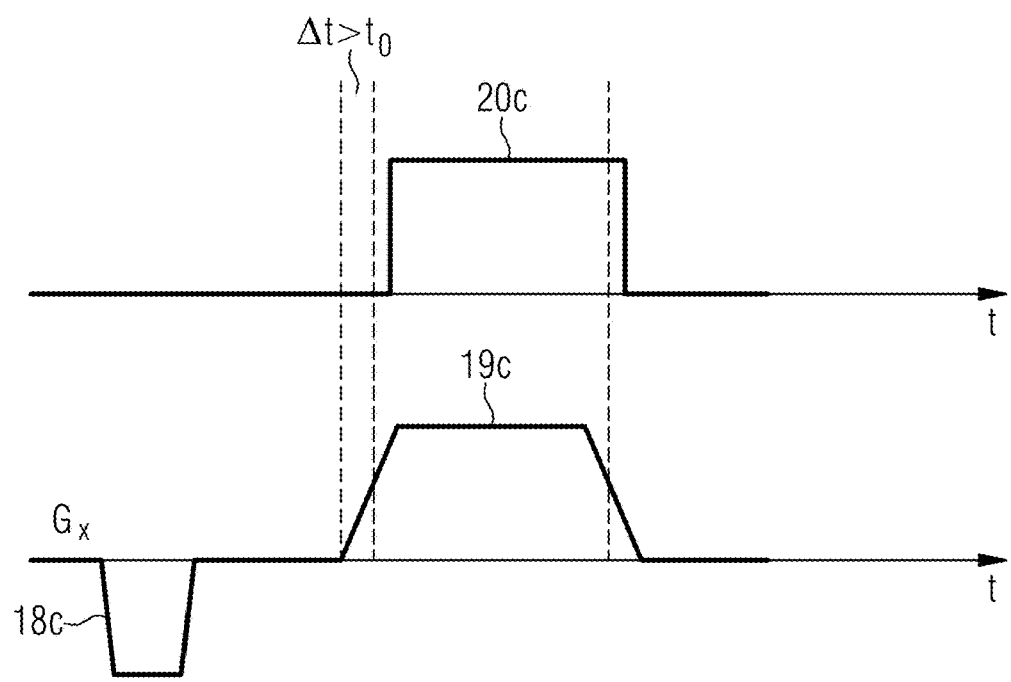

FIG. 6 schematically illustrates a measurement sequence of a method for MR imaging according to one or more exemplary embodiments of the disclosure.

Figure 7:
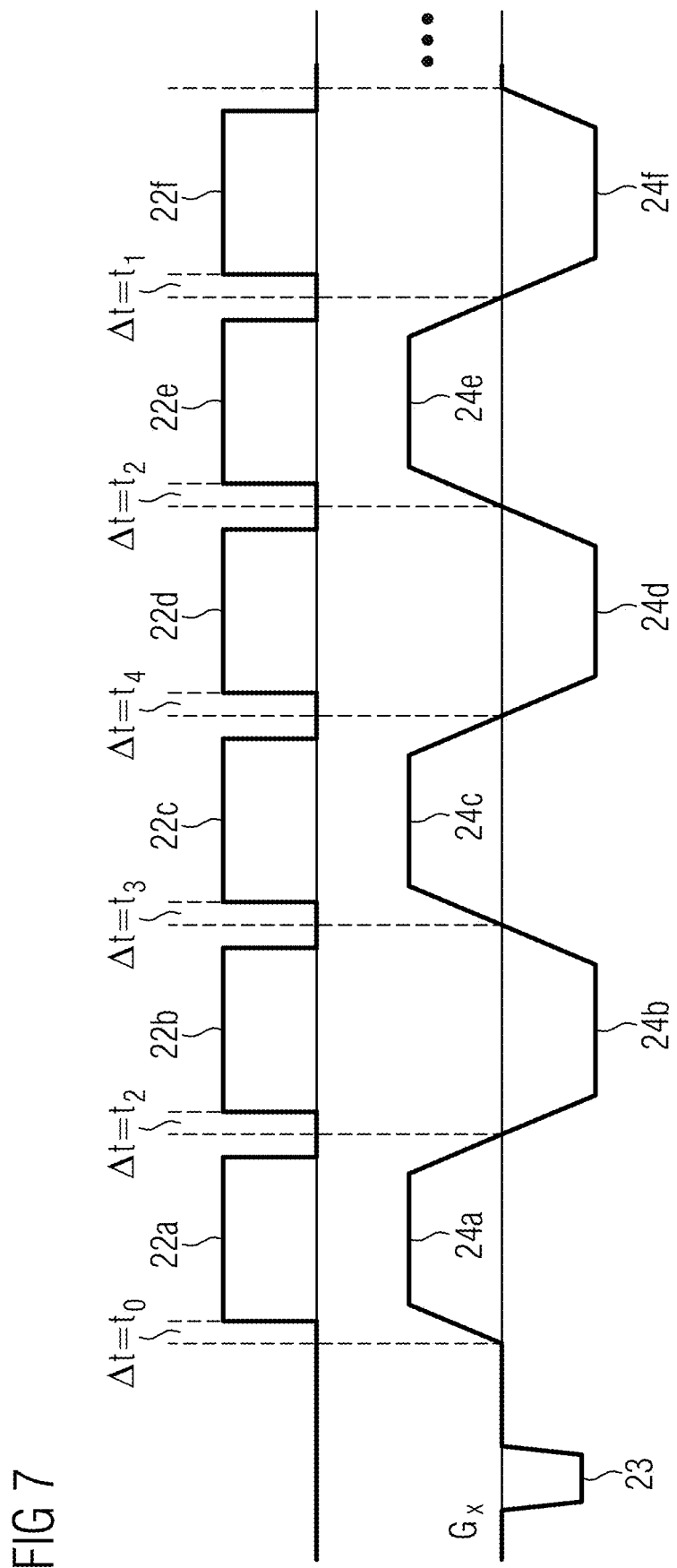

FIG. 7 schematically illustrates a measurement sequence of a method for MR imaging according to one or more exemplary embodiments of the disclosure.

Figure 8:
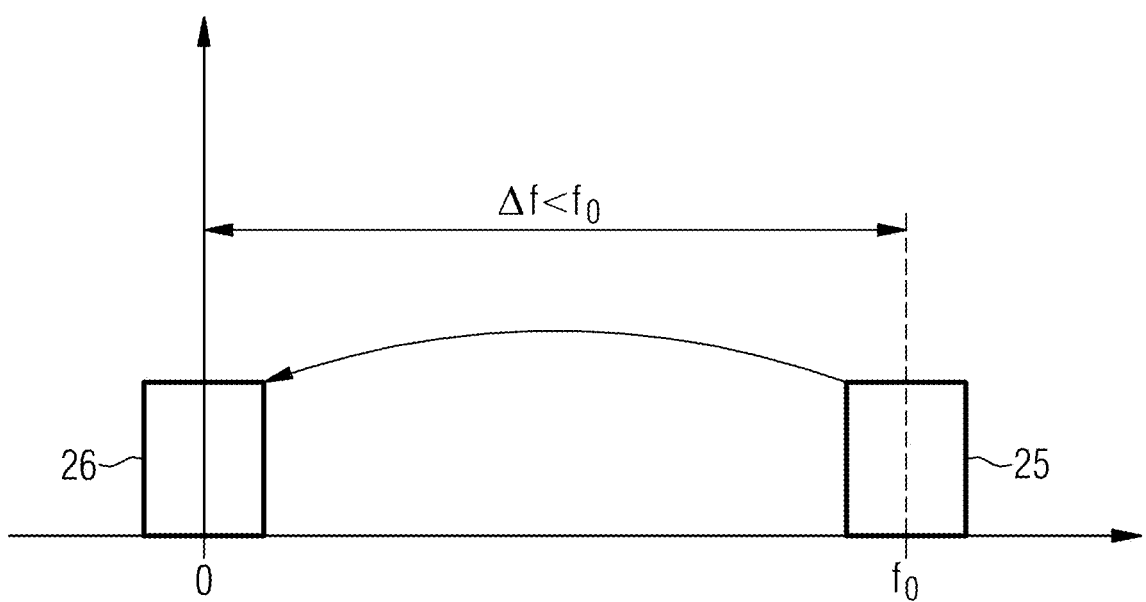

FIG. 8 schematically illustrates a frequency conversion of a method for MR imaging according to one or more exemplary embodiments of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to reduce interference effects in MR imaging, in particular interference effects that are temporally linked to the start of a respective readout time period.

The disclosure is based on the concept of implementing a random component for reading out or processing the MR signals. For this purpose, different readout periods are randomly or pseudo-randomly delayed and/or the center frequency for frequency conversion is randomly or pseudo-randomly shifted.

According to one aspect of the disclosure, a method for magnetic resonance imaging, MRI, is disclosed. A receiving antenna is used to acquire an MR signal for each readout gradient pulse of a plurality of readout gradient pulses during a readout period associated with the respective readout gradient pulse. Based on the MR signals acquired, in particular all of the acquired MR signals, an MR image, in particular an MR image in real space, is generated, in particular reconstructed.

In a first variant, a start time of the respective readout period is delayed with respect to a start time of the respective associated readout gradient pulse by a delay duration which is randomly or pseudo-randomly selected from two or more predefined time values for each readout gradient pulse of the plurality of readout gradient pulses.

According to a second variant, the acquired MR signals are each processed to generate the MR image, wherein the processing includes frequency conversion, in particular frequency conversion for frequency reduction, based around a center frequency, wherein the center frequency is selected randomly or pseudo-randomly from two or more predetermined frequency values for each readout gradient pulse of the plurality of readout gradient pulses.

The first variant and the second variant can also be combined, so that the start times of the readout gradient pulses are delayed by the delay duration randomly or pseudo-randomly selected from the two or more predefined time values and, in addition, the center frequency for frequency conversion is randomly or pseudo-randomly selected from two or more predetermined frequency values.

In particular, also according to the first variant for generating the MR image, the acquired MR signals are each processed, wherein the processing includes frequency conversion based around a center frequency. However, in the first variant, the center frequency can be the same for all the readout gradient pulses or, if the first variant is combined with the second variant, can be selected randomly or pseudo-randomly from the two or more predefined frequency values, as described.

In addition to the aforementioned readout gradient pulses, further gradient pulses can also be switched, for example for slice selection, for position encoding and/or for sampling k-space, as well as radiofrequency pulses for exciting, refocusing, dephasing, flipping etc. of the nuclear spins in accordance with known measurement sequences.

Moreover, additional MR signals can be acquired by means of the receiving antenna in additional readout periods and/or by means of additional receiving antennas and the MR image can be generated depending on the acquired MR signals and the acquired additional MR signals according to reconstruction methods that are known per se, except for the random or pseudo-random selection of the time values and/or the frequency values.

Depending on the type of measurement sequence, the plurality of readout gradient pulses can be a plurality of successive readout gradient pulses within a single measurement sequence or the plurality of readout gradient pulses can be distributed over a plurality of measurement sequences. It is therefore also possible for a measurement sequence to contain only one of the readout gradient pulses.

A readout period begins at the corresponding start time and ends at the corresponding end time. For the corresponding readout period, the MR signal is only acquired or used for reconstruction in the time from the start time to the end time. A gradient amplitude of a readout gradient pulse is in particular zero at the corresponding start time of the readout gradient pulse and likewise zero at a corresponding end time of the respective readout gradient pulse. The gradient amplitude can be non-zero between the start time and the end time of the readout gradient pulse. It can be a unipolar pulse, so that there is no zero crossing of the gradient amplitude between the start time and the end time, or a bipolar pulse during which such a zero crossing occurs. The gradient amplitude as a function of time is, for example, identical for all the readout gradient pulses of the plurality of readout gradient pulses. However, bipolar readout gradient pulses are usually two different gradient events, wherein a first component and a second component of the bipolar readout gradient pulse are the same except for opposite amplitudes.

In particular, a duration of the readout gradient pulses, i.e. a time difference between the corresponding start time and end time, is the same for all the readout gradient pulses of the plurality of readout gradient pulses. Accordingly, a duration of all the readout periods assigned to the readout gradient pulses of the plurality of readout gradient pulses, i.e. a corresponding time difference between the start time and the end time of the respective readout period, is also the same. For example, the number of sampling points within a readout period, i.e. the corresponding sampling rate, is also the same for all the readout periods.

Frequency conversion involves in particular converting the respective MR signal from a frequency band centered around a first central frequency to a frequency band centered around a second central frequency that is lower than the first central frequency. The first central frequency corresponds in particular to a Larmor frequency and the second central frequency corresponds to the difference between the first central frequency and the center frequency for frequency conversion. As a result, a radiofrequency component of the MR signal is removed or approximately removed by means of the frequency conversion so that, in other words, an envelope of the MR signal is determined.

The two or more predefined time values themselves are not random or pseudo-random, but fixed. Only the selection of the delay duration for the individual readout periods is random or pseudo-random. For random or pseudo-random selection of the delay duration from the two or more predefined time values, each time value can be assigned an identifier, for example a number from 1 to N, where N corresponds to the total number of the two or more predefined time values. A random number generator or a pseudo-random number generator is then used to determine a random or pseudo-random sequence of the identifiers, for example numbers from 1 to N, and assign them to the readout periods according to their time sequence. This applies analogously to the center frequencies in corresponding embodiments.

The number N of the two or more time values is not necessarily equal to the number of readout periods or the number of the plurality of readout gradient pulses, but is in particular smaller. Accordingly, different readout periods can be assigned the same delay duration. The time values of the two or more predefined time values are in particular all smaller than a predetermined maximum delay. In particular, the maximum delay can be selected such that a predefined order of the readout periods with respect to one another does not change due to the different delay duration, especially if a plurality of the readout periods are within a single measurement sequence. The specific selection of the maximum delay duration then depends, for example, on a desirable or required time difference between the individual readout periods. In particular, the maximum delay duration is less than the respective duration of the readout periods, in particular less than or equal to one tenth, one twentieth, one fiftieth or one hundredth of the duration of the readout periods.

The two or more time values are different from one another. One of the two or more time values can also be zero. The delay duration does not necessarily have to be defined in relation to the start time of the respective readout gradient pulse. Rather, it can also be defined in relation to another characteristic time of the respective readout period, for example with respect to a switchover instant between a gradient ramp and a gradient flat top, where applicable. There is nonetheless always a delay of the start times of the readout period and the associated readout gradient pulse in relation to one another.

Both the random or pseudo-random delay of the readout periods and the random or pseudo-random shift of the center frequency for frequency conversion cause an incoherence of the data of the different readout periods used for reconstruction, in particular an incoherence in k-space. As a result, disturbances due to phenomena linked to the start of the respective readout period, i.e. that always occur simultaneously with the start time of the readout period or always at a specific time after the start time of the readout period or in a limited period after the start time of the readout period, are "smeared" in k-space. This in turn means that the corresponding artifacts and disturbances in the reconstructed MR image are less pronounced in real space.

It should be noted that the delay of the readout periods or rather the shift of the center frequency is considered in particular when generating the reconstructed MR image, so that the data required for reconstruction, particularly in the proximity of the k-space center, of the individual partial k-spaces match each other in the readout direction. In other words, the acquired data is in particular brought to the position in k-space defined by the readout gradient pulse and then used accordingly for reconstruction. As the disturbances are temporally linked to the start of the respective readout period, the resulting artifacts are therefore located at different positions in k-space for different readout periods.

According to at least one embodiment of the second variant or a combination of the first and second variants, the frequency conversion includes a respective downmixing of the acquired MR signals based around the center frequency.

In particular, the corresponding MR signal is fed to a mixer which is also supplied with a reference signal having the center frequency. The reference signal can be generated using a local oscillator, for example. The reference signal is in particular a sinusoidal signal or an approximately sinusoidal signal with the center frequency. Such downmixing is a feature of conventional methods for processing MR signals to reconstruct the MR image. However, in contrast to conventional methods, the corresponding embodiments according to the disclosure do not use the same center frequency, namely in particular the Larmor frequency, but the center frequency is determined randomly or pseudo-randomly as described above. As a result, the desired incoherence according to the disclosure can be advantageously achieved by adapting existing electronic components or supplementing them.

According to at least one embodiment, the respective center frequency is determined as the sum of a predefined Larmor frequency and a frequency difference, wherein the respective frequency difference is selected randomly or pseudo-randomly from two or more predefined frequency difference values.

The random or pseudo-random selection of the frequency difference means that the center frequency is also selected randomly or pseudo-randomly. The resulting center frequency can be larger or smaller than the Larmor frequency, depending on the value of the frequency difference. The frequency differences can therefore be positive or negative. In this way, the desired incoherence according to the disclosure can be realized in a controlled manner.

In particular, the absolute values of the two or more predefined frequency difference values are each smaller than a predetermined maximum frequency difference. The maximum frequency difference is smaller than the Larmor frequency, for example smaller than or equal to one tenth, one twentieth, one fiftieth or one hundredth of the Larmor frequency. As a result, the original objective of the frequency conversion, namely the extraction of the envelope of the corresponding MR signal, is still achieved to a good approximation.

According to at least one embodiment, in particular according to the first variant or a combination of the first variant with the second variant, a number of the readout gradient pulses of the plurality of readout gradient pulses is greater than the number of the two or more time values.

As a result, the desired incoherence according to the disclosure can be achieved, in particular the individual time values can be defined differently enough from one another to achieve the incoherence without introducing a possibly excessively large time shift for individual readout periods.

The number of readout gradient pulses can, for example, be in the range [5, 500] or in the range [10, 500] or in the range [20, 200]. The number of the two or more time values can then be in the range [3, 50] or in the range [3, 20], for example, wherein it is always ensured that the number of the two or more time values is smaller than the number of the readout gradient pulses. The number of the two or more frequency values can also be in the range [3, 50] or in the range [3, 20], wherein, for example, it is always ensured that the number of the two or more frequency values is smaller than the number of the readout gradient pulses.

According to at least one embodiment, the readout gradient pulses of the plurality of readout gradient pulses follow one another, in particular in immediate succession, within a single measurement sequence.

For example, a radiofrequency excitation pulse is switched and the readout gradient pulses of the plurality of readout gradient pulses are all switched after the radiofrequency excitation pulse and before a further radiofrequency excitation pulse is switched.

In such measurement sequences with a large number of readout gradient pulses, time-defined or time-limited phenomena that produce interference effects can, for example, occur more frequently, so that the disclosure has a particularly advantageous effect here.

According to at least one embodiment, the readout gradient pulses of the plurality of readout gradient pulses have alternating polarity within the measurement sequence.

The readout gradient pulses are therefore in particular unipolar gradient pulses with alternating polarity within the measurement sequence.

In such measurement sequences with a large number of readout gradient pulses, time-defined or time-limited phenomena that produce interference effects can occur more frequently, for example, so that the disclosure has a particularly advantageous effect here.

According to at least one embodiment, the measurement sequence is performed as echo-planar imaging (EPI) recording or as segmented EPI recording.

In EPI recording, the entire k-space of a given excited slice is sampled within a single measurement sequence. In segmented EPI recording, a plurality of consecutive measurement sequences are used to sample the k-space of an excited slice.

In such measurement sequences with a large number of readout gradient pulses, time-defined or time-limited phenomena that produce interference effects can occur more frequently, for example, so that the disclosure has a particularly advantageous effect here.

According to at least one embodiment, each readout gradient pulse of the plurality of readout gradient pulses has a first ramp phase, a plateau phase following the first ramp phase, and a second ramp phase following the plateau phase. The start time of the respective readout period is within the first ramp phase and/or the end time of the respective readout period is within the second ramp phase.

The plateau phase can also be referred to as a gradient flat top and the ramp phases can be referred to as gradient ramps. During the plateau phase, the amplitude of the readout gradient pulse is in particular constantly or approximately constantly equal to a plateau value. The sign of the gradient amplitude during the plateau phase corresponds to the polarity of the readout gradient pulse or, in the case of bipolar readout gradient pulses, to the polarity of the corresponding portion of the readout gradient pulse. During the first ramp phase, the gradient amplitude changes in particular from zero to the plateau value, for example in a linear or approximately linear manner. During the second ramp phase, the gradient amplitude changes from the plateau value to zero, in particular in a linear or approximately linear manner.

Since the start time of the readout period is within the first ramp phase and/or the end time of the readout period is within the second ramp phase, ramp sampling is therefore primarily used. This is particularly advantageous, as it provides more time for signal acquisition than if signal acquisition were to take place only during the plateau phase.

According to at least one embodiment, the amplitude of the readout gradient pulse changes linearly or approximately linearly from zero to the plateau value during the first ramp phase, is constantly or approximately constantly equal to the plateau value during the plateau phase, and changes linearly or approximately linearly from the plateau value to zero during the second ramp phase.

In this way, the gradient pulses can be generated in a particularly simple manner.

Approximately linear and approximately constant can be understood as meaning that a linear or constant progression of the gradient amplitude is aimed for or set, but the actual progression may deviate to the usual extent due to tolerances or other variations.

According to a further aspect of the disclosure, an MR imaging system is specified. The MR imaging system has a gradient coil array, a receiving antenna, a signal acquisition unit connected to the receiving antenna and at least one controller. The at least one controller is configured to activate the gradient coil array to generate a plurality of readout gradient pulses and to activate the signal acquisition unit to acquire an MR signal received by means of the receiving antenna for each readout gradient pulse of the plurality of readout gradient pulses during a respective readout period. The MR imaging system has an evaluation unit (evaluator) which is configured to generate, in particular reconstruct, an MR image based on the MR signals detected.

According to a first variant, the at least one controller is configured to delay a start time of the respective readout period relative to a start time of the respective readout gradient pulse by a delay duration and to select the delay duration for each readout gradient pulse randomly or pseudo-randomly from two or more predefined time values.

According to a second variant, the at least one controller is configured to activate the signal acquisition unit to perform frequency conversion based around a center frequency for the respective processing of the acquired MR signals and to select the center frequency for each of the readout gradient pulses randomly or pseudo-randomly from two or more predefined frequency values.

In various embodiments, the first and second variants of the MR imaging system can also be combined.

In particular, the at least one controller comprises at least one computing unit (computer, processor). In particular, a computing unit can be understood as meaning a data processing device comprising a processing circuit. In particular, the computing unit can therefore process data to perform computing operations. This can also include operations to perform indexed accesses to a data structure, for example a look-up table (LUT).

In particular, the computing unit can comprise one or more computers, one or more microcontrollers and/or one or more integrated circuits, for example one or more application-specific integrated circuits (ASICs), one or more field-programmable gate arrays (FPGAs), and/or one or more systems-on-a-chip (SoCs). The computing unit can also include one or more processors, for example one or more microprocessors, one or more central processing units (CPUs), one or more graphics processing units (GPUs), and/or one or more signal processors, in particular one or more digital signal processors (DSPs). The computing unit may also include a physical or virtual network of computers or other such units.

In various exemplary embodiments, the computing unit includes one or more hardware and/or software interfaces and/or one or more memory units.

A memory unit can be designed as a volatile data memory, for example a dynamic random access memory (DRAM) or a static random access memory (SRAM), or a non-volatile data memory, for example a read-only memory (ROM), a programmable read-only memory (PROM), an erasable programmable read-only memory (EPROM), an electrically erasable programmable read-only memory (EEPROM), a flash memory or flash EEPROM, a ferroelectric random access memory (FRAM), a magnetoresistive random access memory (MRAM) or a phase-change random access memory (PCRAM).

According to at least one embodiment, the signal acquisition unit has a mixer which is configured to mix down the acquired MR signals with the center frequency for frequency conversion.

According to at least one embodiment, the MR imaging system has a radiofrequency coil array, wherein the at least one controller is configured to control the radiofrequency coil array and the gradient coil array such that the readout gradient pulses of the plurality of readout gradient pulses follow one another for example in immediate succession in a measurement sequence, in particular a single measurement sequence.

According to at least one embodiment, the at least one controller is configured to control the radiofrequency coil array and the gradient coil array such that the readout gradient pulses of the plurality of readout gradient pulses have alternating polarity within the measurement sequence.

According to at least one embodiment, the at least one controller is configured to control the radiofrequency coil array and the gradient coil array such that the measurement sequence is performed as an EPI recording, i.e. as an EPI measurement sequence, or as a segmented EPI recording measurement sequence.

In some embodiments, the at least one controller may also incorporate or partially incorporate the signal acquisition unit and/or incorporate or partially incorporate the evaluator.

Further embodiments of the MR imaging system according to the disclosure proceed directly from the various embodiments of the method according to the disclosure and vice versa. In particular, individual features and corresponding explanations as well as advantages relating to the various embodiments of the method according to the disclosure are analogously transferrable to corresponding embodiments of the MR imaging system according to the disclosure. In particular, the MR imaging system according to the disclosure is configured or programmed to carry out a method according to the disclosure. In particular, the MR imaging system according to the disclosure carries out the method according to the disclosure.

According to a further aspect of the disclosure, a computer program comprising commands is provided. When the commands are executed by an MR imaging system according to the disclosure, in particular by the at least one controller of the MR imaging system, the commands cause the MR imaging system to carry out a method according to the disclosure for MR imaging.

The commands can be for example in the form of program code. For example, the program code can be provided as binary code or assembler and/or as source code of a programming language such as C, for example, and/or as a program script, such as Python, for example.

According to a further aspect of the disclosure, a computer-readable storage medium is provided which stores a computer program according to the disclosure.

The computer program and the computer-readable storage medium are each computer program products comprising the commands.

Further features of the disclosure will emerge from the claims, the figures, detailed description, and the description of the figures. The features and combinations of features mentioned above in the description as well as the features and combinations of features mentioned below in the figure description and/or shown in the figures may be incorporated in the disclosure not only in the respective combination specified, but also in other combinations. In particular, embodiments and combinations of features may also be covered by the disclosure which do not have all the features of a claim as originally formulated. In addition, the disclosure can comprise embodiments and combinations of features which go beyond or deviate from the combinations of features set forth in the references of the claims.

FIG. 1 schematically illustrates an exemplary embodiment of the MR imaging system 1 according to the disclosure.

The MR imaging system 1 comprises an MR scanner having a field magnet 3 that can generate a static magnetic field to align the nuclear spins of an object 8 to be imaged. The MR scanner can have a patient tunnel 2 comprising an imaging area, wherein the static magnetic field is highly homogeneous with respect to its magnetic field strength and/or absolute value within the imaging area. The object 8 can be disposed on a patient table 7 which can be movable to change the position of the object 8.

The field magnet 3 can be a superconducting magnet, for example, i.e. an electromagnet with a superconducting coil. This enables static magnetic fields of up to 3 T or more to be achieved. For lower field strengths, permanent magnets or electromagnets with normally conducting coils can also be used.

The MR scanner further comprises a gradient coil array 5, which can generate variable magnetic fields along each of the three spatial dimensions X, Y, Z and superimpose the variable magnetic fields on the main magnetic field to achieve position encoding. The gradient coils of the gradient coil array 5 can be normally conducting coils. In particular, the gradient coils can comprise one or more gradient coils for generating a magnetic field gradient in the X direction, one or more gradient coils for generating magnetic field gradients in the Y direction and one or more gradient coils for generating magnetic field gradients along the Z direction.

In addition, the MR scanner can have one or more transmit coils 4 to generate radiofrequency pulses to excite nuclear spins for precessional motion in the corresponding magnetic field. The transmit coils 4 can also act as receiving antennas to receive MR signals in response to the nuclear spin excitation and precession resonance. Alternatively, or in addition, one or more dedicated receive coils 6 can be used, for example body coils disposed in the immediate vicinity of the object 8.

The MR imaging system 1 also comprises a control system which can include one or more computing units (computer) and additional electronic components (controller, processor, processing circuitry) for controlling the MR scanner and/or processing the MR signals. The control system (controller) 100 may include an evaluation unit (evaluator) 9, a signal acquisition unit 10, and at least one controller 11, 12, for example a radiofrequency controller 11 and a gradient controller 12. The gradient controller 12 is configured, for example, to supply the gradient coils with variable currents via feed lines, said currents being able to provide the desired gradient fields in the imaging area in a time-coordinated manner, in particular in the form of gradient pulses. The radiofrequency controller 11 is configured, for example, to generate radiofrequency pulses, for example excitation pulses, having predefined time characteristics, amplitudes and spectral power distribution to excite a magnetic resonance of the nuclear spins. In an exemplary embodiment, the controller 11 and/or 12 include processing circuitry configured to perform one or more functions or operations of the controller 11 and/or controller 12, respectively.

A method according to the disclosure can be carried out by means of the MR imaging system 1. Figures FIG. 4 to FIG. 8 schematically illustrate details of various exemplary embodiments of such a method according to the disclosure.

The gradient controller 12 may be configured to activate the gradient coil array 5 to generate a plurality of readout gradient pulses 19*a*, 19*b*, 19*c*, 24*a*, 24*b*, 24*c*, 24*d*, 24*e*, 24*f* and, for each readout gradient pulse 19*a*, 19*b*, 19*c*, 24*a*, 24*b*, 24*c*, 24*d*, 24*e*, 24*f* during a respective readout period 20*a*, 20*b*, 20*c*, 22*a*, 22*b*, 22*c*, 22*d*, 22*e*, 22*f*, to activate the signal acquisition unit 10 to acquire an MR signal received by means of one of the receiving antennas 4, 6. The evaluator 9 may be configured to generate an MR image based on the acquired MR signals. In order to generate the MR image, the gradient controller 12 may be configured to perform frequency conversion based around a center frequency for the respective processing of the acquired MR signals in order to mix down the MR signals.

The gradient controller 12 may be configured to delay a start time of the respective readout period 20a, 20b, 20c, 22a, 22b, 22c, 22d, 22e, 22f relative to a start time of the respective readout gradient pulse 19a, 19b, 19c, 24a, 24b, 24c, 24d, 24e, 24f by a delay duration and to randomly or pseudo-randomly select the delay duration for each of the readout gradient pulses 19a, 19b, 19c, 24a, 24b, 24c, 24d, 24e, 24f from two or more predefined time values.

Alternatively, or additionally, the signal acquisition unit 10 may be configured to randomly or pseudo-randomly select the center frequency for each of the readout gradient pulses 19a, 19b, 19c, 24a, 24b, 24c, 24d, 24e, 24f from two or more predetermined frequency values.

This results in an incoherence of the individual evaluation periods 20a, 20b, 20c, 22a, 22b, 22c, 22d, 22e, 22f with respect to one another, which smears artifacts 14 in k-space and thus at least partially compensates for corresponding artifacts 17 in real space.

FIG. 2 schematically illustrates an exemplary k-space recording 13 with stripe-shaped artifacts 14 which can occur, in particular, if a method according to the disclosure is not used. FIG. 3 schematically illustrates an associated MR image 15 of an object 16 in real space with corresponding artifacts 17.

Figures FIG. 4, FIG. 5 and FIG. 6 show schematic sequence diagrams for three readout gradient pulses 19a, 19b, 19c and corresponding readout periods 20a, 20b, 20c according to an exemplary embodiment of an MR imaging method according to the disclosure. The readout gradient pulses 19a, 19b, 19c correspond, for example, to different measurement sequences. During the associated readout periods 20a, 20b, 20c, an MR signal may be received in each case and an MR image may be generated at least also based on the MR signals received during the readout periods 20a, 20b, 20c. In the upper half of FIGS. 4, 5, 6, the readout period 20a, 20b, 20c is shown as a function of time t in each case. In the lower half, the gradient amplitude $G_X$ is shown in the readout direction or rather in the frequency encoding direction. For example, a dephasing gradient pulse 18a, 18b, 18c, in particular with negative polarity, may be switched in each case and then a respective readout gradient pulse 19a, 19b, 19c with opposite polarity, in particular positive polarity. While the readout gradient pulses 19a, 19b, 19c are being switched, a gradient echo signal may be generated accordingly. Corresponding slice selection gradients in the Z direction or gradients for phase encoding, etc. in the Y direction are not shown for the sake of clarity.

The readout gradient pulses 19a, 19b, 19c each have the same shape and duration, i.e. in particular the same amplitude characteristic. The durations of the readout periods 20a, 20b, 20c are also the same. The respective start time of the readout period 20a, 20b, 20c may be delayed by a delay duration Δt relative to a start time of the associated readout gradient pulse 19a, 19b, 19c. The delay durations Δt are selected randomly or pseudo-randomly from two or more predefined time values. In the example in FIG. 4, Δt is equal to a predefined nominal delay time t0. In the example in FIG. 5, Δt is less than t0 and in the example in FIG. 6, Δt is greater than t0.

In the examples in FIGS. 4, 5, 6, the readout gradient pulses 19a, 19b, 19c each have a first ramp phase 21a, followed by a plateau phase 21b, followed in turn by a second ramp phase 21c. For example, the start time of the readout periods 20a, 20b, 20c is in the first ramp phase 21a and the end time is in the second ramp phase 21c in each case. In particular, ramp sampling is therefore performed.

Artifacts arising for example due to disturbances temporally linked to the start of the respective readout period, such as glitches, are partially or completely compensated for by the random or pseudo-random delay of the readout gradient pulses 19a, 19b, 19c.

FIG. 7 shows a schematic sequence diagram of an EPI sequence according to another exemplary embodiment of a method according to the disclosure. Here, after a dephasing gradient pulse 23, a plurality of directly consecutive unipolar readout gradient pulses 24a, 24b, 24c, 24d, 24e, 24f with alternating polarity are provided. The shape of the individual readout gradient pulses 24a, 24b, 24c, 24d, 24e, 24f corresponds, for example, to the shape described with reference to FIGS. 4 to 6. Again, each of the readout gradient pulses 24a, 24b, 24c, 24d, 24e, 24f may be assigned a readout period 22a, 22b, 22c, 22d, 22e, 22f, wherein for example ramp sampling may be also performed. For example, four different values t0, t1, t2, t3 are provided here for the delay durations Δt. For the successive readout gradient pulses 24a, 24b, 24c, 24d, 24e, 24f or their associated readout periods 22a, 22b, 22c, 22d, 22e, 22f, one of the values t0, t1, t2, t3 may be selected randomly or pseudo-randomly in each case. In the example in FIG. 7, the delay duration Δt for the first readout period 22a shown is t0, for the second readout period 22b it is t2, for the third readout period 22c it is t3, for the fourth readout period 22d it is t1, for the fifth readout period 22e it is t2, and for the sixth readout period 22f it is again t1.

Alternatively, or in addition to the random delay of the start times of the readout periods 20a, 20b, 20c, 22a, 22b, 22c, 22d, 22e, 22f, the center frequency for the frequency conversion for downmixing the respective MR signals can be selected randomly or pseudo-randomly, in particular around a predefined Larmor frequency. This is shown schematically in FIG. 8. The MR signal may be detected in the frequency band 25 which is centered around the Larmor frequency $f_0$, for example. By downmixing using the center frequency Δf which is lower than the Larmor frequency $f_0$ in the example shown, the frequency band 25 may be converted to a lower frequency band 26 that is centered around the center frequency ($f_0$−Δf). By randomly or pseudo-randomly selecting the value for Δf, the desired incoherence according to the disclosure is also achieved or increased.

As described, in particular with regard to the figures, the disclosure makes it possible to reduce interference effects in MR imaging.

In various embodiments, the start times of the ADC recording periods in the individual k-space lines are shifted slightly relative to one another in order to achieve an incoherent distribution of possible artifacts. In particular, a smearing of the artifact energy in k-space is achieved, which accordingly results in a reduction of artifacts in the reconstructed MR image.

In various embodiments, ramp sampling is performed. In particular, a so-called gridding method is then used for the reconstruction. Here, the data values acquired on the gradient ramps are interpolated back onto a Cartesian grid, as the subsequent reconstruction steps, for example a Fourier transformation, generally expect Cartesian input data. As part of the gridding process, the shifted recordings are then interpolated to the Cartesian grid according to their actual start point.

In various embodiments, the number of data points acquired during a readout period can be reduced from a nominal value, for example to allow for data recording limitations due to neighboring gradients on other axes. In other embodiments, the readout periods can also be slightly extended from a nominal duration in order to still have the full number of data points available.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

The invention claimed is:

1. A method for magnetic resonance (MR) imaging, the method comprising:
   acquiring, for each readout gradient pulse of a plurality of readout gradient pulses during a respective readout period, an MR signal using a receiving antenna; and
   generating an MR image as a function of the acquired MR signals, wherein:
   a start time of the respective readout period is delayed relative to a start time of the respective readout gradient pulse by a delay duration which is randomly or pseudo-randomly selected from two or more predefined time values for each readout gradient pulse; and/or
   to generate the MR image, the acquired MR signals are each processed, the processing including a frequency conversion based around a center frequency selected randomly or pseudo-randomly from two or more predetermined frequency values for each readout gradient pulse.

2. The method as claimed in claim 1, wherein the readout gradient pulses of the plurality of readout gradient pulses are consecutive in a measurement sequence.

3. The method as claimed in claim 2, wherein the readout gradient pulses of the plurality of readout gradient pulses have alternating polarity within the measurement sequence.

4. The method as claimed in claim 2, wherein the measurement sequence is performed as an echo-planar imaging recording or as a measurement sequence of a segmented echo-planar imaging recording.

5. The method as claimed in claim 1, wherein:
each readout gradient pulse of the plurality of readout gradient pulses has a first ramp phase, a plateau phase following the first ramp phase, and a second ramp phase following the plateau phase; and
the start time of the respective readout period is within the first ramp phase and/or an end time of the respective readout period is within the second ramp phase.

6. The method as claimed in claim 5, wherein an amplitude of the readout gradient pulse:
changes linearly or approximately linearly from zero to a plateau value during the first ramp phase;
is constantly or approximately constantly equal to the plateau value during the plateau phase; and
changes linearly or approximately linearly from the plateau value to zero during the second ramp phase.

7. The method as claimed in claim 1, wherein:
a number of the readout gradient pulses of the plurality of readout gradient pulses is greater than the number of the two or more time values; and/or
the number of the readout gradient pulses of the plurality of readout gradient pulses is greater than the number of the two or more frequency values.

8. The method as claimed in claim 1, wherein the frequency conversion comprises a respective downmixing of the acquired MR signals based around the center frequency.

9. The method as claimed in claim 1, wherein the respective center frequency is determined as a sum of a predefined Larmor frequency and a frequency difference, wherein the respective frequency difference is selected randomly or pseudo-randomly from two or more predefined frequency difference values.

10. A magnetic resonance (MR) imaging system comprising:
a gradient coil array;
a receiving antenna; a signal acquisition unit connected to the receiving antenna;
at least one controller configured to:
activate the gradient coil array to generate a plurality of readout gradient pulses; and
for each readout gradient pulse of the plurality of readout gradient pulses during a respective readout period, activate the signal acquisition unit to acquire an MR signal received using the receiving antenna; and
an evaluator configured to generate an MR image based on the acquired MR signals,
wherein the at least one controller is further configured to:
delay a start time of the respective readout period, relative to a start time of the respective readout gradient pulse by a delay duration and to select the delay duration for each of the readout gradient pulses randomly or pseudo-randomly from two or more predefined time values; and/or
activate the signal acquisition unit to perform frequency conversion based around a center frequency for respective processing of the acquired MR signals, and select the center frequency for each of the readout gradient pulses randomly or pseudo-randomly from two or more predetermined frequency values.

11. The MR imaging system as claimed in claim 10, wherein the signal acquisition unit comprises a mixer configured to mix down the acquired MR signals based around the center frequency for frequency conversion.

12. The MR imaging system as claimed in claim 10, further comprising a radiofrequency coil array, wherein the at least one controller is further configured to control the radiofrequency coil array and the gradient coil array such that the readout gradient pulses of the plurality of readout gradient pulses are consecutive in a measurement sequence.

13. The MR imaging system as claimed in claim 12, wherein the at least one controller is further configured to control the radiofrequency coil array and the gradient coil array such that the readout gradient pulses of the plurality of readout gradient pulses have alternating polarity within the measurement sequence.

14. The MR imaging system as claimed in claim 12, wherein the at least one controller is further configured to control the high frequency coil array and the gradient coil array such that the measurement sequence is performed as an echo-planar imaging recording or as a measurement sequence of a segmented echo-planar imaging recording.

15. A non-transitory computer readable medium storing instructions, when executed by a magnetic resonance (MR) imaging system, causes the MR imaging system to perform the method as claimed in claim 1.

* * * * *